(12) United States Patent
Moon (10) Patent No.: US 12,004,321 B2
(45) Date of Patent: Jun. 4, 2024

(54) RACK-MOUNTABLE IMMERSION COOLING SYSTEM

(71) Applicant: 3M INNOVATIVE PROPERTIES COMPANY, St. Paul, MN (US)

(72) Inventor: Sung Won Moon, Woodbury, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 248 days.

(21) Appl. No.: 17/596,624

(22) PCT Filed: Jun. 9, 2020

(86) PCT No.: PCT/IB2020/055410
§ 371 (c)(1),
(2) Date: Dec. 15, 2021

(87) PCT Pub. No.: WO2020/254917
PCT Pub. Date: Dec. 24, 2020

(65) Prior Publication Data
US 2022/0248564 A1 Aug. 4, 2022

Related U.S. Application Data

(60) Provisional application No. 62/862,784, filed on Jun. 18, 2019.

(51) Int. Cl.
*H05K 7/20* (2006.01)

(52) U.S. Cl.
CPC ..... *H05K 7/20236* (2013.01); *H05K 7/20263* (2013.01); *H05K 7/20781* (2013.01)

(58) Field of Classification Search
CPC combination set(s) only.
See application file for complete search history.

(56) References Cited

U.S. PATENT DOCUMENTS

| 7,254,024 | B2 | 8/2007 | Salmon | |
| 8,184,436 | B2 * | 5/2012 | Campbell | H05K 7/203 361/701 |
| 10,568,234 | B1 * | 2/2020 | Mao | H05K 7/20781 |
| 11,006,547 | B2 * | 5/2021 | Gao | G06F 1/20 |
| 11,169,582 | B2 * | 11/2021 | Mao | H01M 10/613 |

(Continued)

FOREIGN PATENT DOCUMENTS

| EP | 3376337 | 9/2018 |
| EP | 3379377 | 9/2018 |

(Continued)

OTHER PUBLICATIONS

International Search Report for PCT International Application No. PCT/IB2020/055410, dated Sep. 3, 2020, 5 pages.

*Primary Examiner* — Lisa Lea-Edmonds
(74) *Attorney, Agent, or Firm* — Jonathan L. Tolstedt (57) ABSTRACT

An immersion cooling system includes a plurality of spaced-apart cooling plates defining a plurality of subvolumes therebetween, the cooling plates at least partially immersed in a first liquid coolant, so that the first liquid coolant at least partially fills each subvolume; a second liquid coolant flowing through at least a portion of each cooling plate; and at least one electronic device at least partially immersed in the first liquid coolant within each subvolume.

16 Claims, 8 Drawing Sheets

(56) References Cited

U.S. PATENT DOCUMENTS

| | | | |
|---|---|---|---|
| 11,178,790 B2* | 11/2021 | Aoki | H05K 7/20772 |
| 11,602,075 B2* | 3/2023 | Zhong | H05K 7/20272 |
| 11,714,467 B2* | 8/2023 | Mao | H01M 10/613 |
| | | | 361/699 |
| 11,778,790 B2* | 10/2023 | Edmunds | H05K 7/20236 |
| | | | 361/679.46 |
| 2009/0260777 A1 | 10/2009 | Attlesey | |
| 2010/0118494 A1* | 5/2010 | Campbell | H05K 7/20772 |
| | | | 361/702 |
| 2010/0263885 A1* | 10/2010 | Tuma | A62C 3/16 |
| | | | 169/46 |
| 2011/0315343 A1* | 12/2011 | Campbell | H05K 7/203 |
| | | | 165/80.3 |
| 2011/0315355 A1* | 12/2011 | Campbell | H05K 7/20809 |
| | | | 165/104.33 |
| 2015/0062806 A1* | 3/2015 | Shelnutt | H05K 7/20318 |
| | | | 361/679.53 |
| 2015/0109728 A1* | 4/2015 | Campbell | H05K 7/20336 |
| | | | 361/679.47 |
| 2017/0127576 A1* | 5/2017 | Campbell | H05K 7/2039 |
| 2018/0027695 A1* | 1/2018 | Wakino | H05K 7/20772 |
| | | | 361/699 |
| 2020/0288600 A1* | 9/2020 | Gao | H05K 7/20272 |
| 2022/0039288 A1* | 2/2022 | Mao | G06F 1/20 |

FOREIGN PATENT DOCUMENTS

| | | |
|---|---|---|
| WO | WO 2010-130993 | 11/2010 |
| WO | WO 2018-025016 | 2/2018 |
| WO | WO 2018-096362 | 5/2018 |

* cited by examiner

RACK-MOUNTABLE IMMERSION COOLING SYSTEM

CROSS REFERENCE TO RELATED APPLICATIONS

This application is a national stage filing under 35 U.S.C. 371 of PCT/IB2020/055410, filed Jun. 9, 2020, which claims the benefit of U.S. Provisional Application No. 62/862,784, filed Jun. 18, 2019, the disclosure of which is incorporated by reference in its/their entirety herein.

SUMMARY

In some aspects of the present description, an immersion cooling system is provided, including a plurality of spaced-apart cooling plates defining a plurality of subvolumes therebetween, the cooling plates at least partially immersed in a first liquid coolant, so that the first liquid coolant at least partially fills each subvolume; a second liquid coolant flowing through at least a portion of each cooling plate; and at least one electronic device at least partially immersed in the first liquid coolant within each subvolume.

In some aspects of the present description, an immersion cooling system is provided, including a tank defining an open interior volume and including a cooling plate forming at least one wall of the open interior volume; a first liquid coolant at least partially filling the open interior volume; a second liquid coolant flowing through at least a portion of the cooling plate; and at least one electronic device at least partially immersed in the first liquid coolant within the open interior volume.

In some aspects of the present description, method of cooling electronic devices is provided, including the steps of disposing a plurality of cooling plates so as to define a plurality of subvolumes; at least partially filling each subvolume with a first coolant liquid, such that each of the plurality of cooling plates is at least partially immersed in the first coolant liquid; providing a second coolant fluid disposed within the cooling plate; and disposing at least one electronic device in at least one subvolume such that it is at least partially immersed in the first coolant fluid.

DETAILED DESCRIPTION

In the following description, reference is made to the accompanying drawings that form a part hereof and in which various embodiments are shown by way of illustration. The drawings are not necessarily to scale. It is to be understood that other embodiments are contemplated and may be made without departing from the scope or spirit of the present description. The following detailed description, therefore, is not to be taken in a limiting sense.

According to some aspects of the present description, an immersion cooling system includes a plurality of spaced-apart cooling plates defining a plurality of subvolumes therebetween. For example, in some embodiments, the plurality of cooling plates may be disposed vertically in an open interior volume of a larger immersion tank and spaced a distance apart such that they define a number of smaller subvolumes. In some embodiments, the cooling plates may be at least partially immersed in a first liquid coolant, so that the first liquid coolant at least partially fills each subvolume. In some embodiments, the first liquid coolant may be a dielectric fluid, such that the first liquid coolant may come in direct contact with any electronic devices immersed within the fluid. In some embodiments, each of the subvolumes may be isolated from any other subvolumes (i.e., not in fluidic communication with each other). In some embodiments, at least one subvolume of the plurality of subvolumes may be in fluidic communication with at least one other subvolume of the plurality of subvolumes (i.e., the first liquid coolant may flow between/among two or more subvolumes).

In some embodiments, a second liquid coolant may be allowed to flow through at least a portion of each cooling plate. In some embodiments, the second liquid coolant may be water, such as available facility (tap) water, or any other appropriate liquid coolant. In some embodiments, at least one electronic device (e.g., an electronic server) may be at least partially immersed (i.e., partially submerged) in the first liquid coolant within each subvolume. In some embodiments, the first liquid coolant and the second liquid coolant may be the same liquid coolant. In some embodiments, the electronic device may be sealed against liquid intrusion and the first liquid coolant may be a non-dielectric fluid.

For the purposes of this specification, an electronic device may be any appropriate device, including but not limited to conventional servers, blade servers, and other types of information handling systems. These information handling systems may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a server, a network storage device, or any other suitable device and may vary in size, shape, performance, functionality, and price. The information handling system may include random access memory (RAM), one or more processing resources such as a central processing unit (CPU) or hardware or software control logic, read-only memory (ROM), and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

In some embodiments, the components of an electronic device (e.g., a server) may be distributed across two or more subvolumes. For example, one subvolume may contain a printed circuit board (PCB) holding a power supply for an information handling system, while another subvolume contains a PCB holding a computer motherboard, memory devices, switches, and/or other electronic resources. In some embodiments, only a portion of the subvolumes may contain a liquid coolant, while other subvolumes may be air-cooled (i.e., do not contain a liquid coolant). In some embodiments, it may be desirable to immerse only certain components of an electronic device in liquid coolant, while other components remain outside the liquid coolant. For example, in some embodiments, it may be desirable to place certain components such as optical connections on the electronic device but above the coolant fluid (i.e., on a portion of the PCB not immersed in coolant), or on a separate PCB in a "dry" subvolume.

In some embodiments, the cooling plates may be constructed of aluminum, metal, a thermally-conductive metallic alloy, thermally-conductive polymers, or any other appropriate thermally-conductive material. In some embodiments, each cooling plate may define a coolant passage (e.g., a channel) through the cooling plate that is optimized to meet a specified performance requirement. In some embodiments, the coolant passage is entirely internal to the cooling plate, preventing any of the second liquid coolant from coming in contact with any electronic components. Isolating the second liquid coolant from the electronics allows a larger number of coolant types to be used within the cooling plate, potentially reducing the volume of more expensive coolants (e.g., dielectric fluids) required by the system. For example, ordinary water may be used for the second liquid coolant, or water with appropriate additives to alter the properties of water alone, such as corrosion inhibitors and/or antifreeze. A typical antifreeze may be a solution of a suitable organic chemical (including, but not limited to, ethylene glycol, diethylene glycol, or propylene glycol) in water. These additives may be used to change the properties of the water-based coolant when it has to withstand temperatures below 0° C., or when its boiling point has to be raised beyond 100° C. The two types of glycol most commonly used for liquid cooling applications are ethylene glycol and water (EGW) solutions and propylene glycol and water (PGW) solutions. Ethylene glycol has desirable performance properties, including a high boiling point, low freezing point, stability over a wide temperature range, high specific heat, high thermal conductivity, and low viscosity (i.e., reduced pumping force.)

In some embodiments, a filler material may be placed within server or within one or more subvolumes to reduce the amount of dielectric fluid needed by the system (i.e., to reduce the volume of the system). In some embodiments, a filler material may be a thermal interface material used to reduce interior volumes and to increase the heat transfer between the electronic components and the cooling plates. For example, a filler material may include, but not be limited to, polyethylene, polypropylene, polytetrafluoroethylene (PTFE), or glass, or some combination thereof. In some embodiments, a filler material may be a solid block or filled volume. In some embodiments, a filler material may be a hollow, sealed volume. In some embodiments, the filler material may include a filtration component which may help remove or reduce impurities from the circulating liquid coolant.

In some embodiments, the immersion cooling system may be a stand-alone unit. In some embodiments, the immersion cooling system may be configured to mount in any appropriate outer enclosure, including a standard server rack. For the purposes of this document, the term "standard server rack" shall be defined to mean any standardized frame or enclosure for mounting multiple electronic devices (e.g., electronic equipment modules, such as computer servers). One example of a "standard server rack" is a rack which has a width of approximately 19 inches, and has a height based on a number of "rack units" (sometimes referred to as RU or simply U), where a rack unit is 1.752 inches. Examples of standard server racks include racks which are 40 U, 42 U, or 44 U in height. The dimensions provided herein are examples only and are not limiting in any way. In some embodiments, a standard server rack may include rails (e.g., "drawer" slides) to which electronic equipment (e.g., electronic servers) may be mounted, allowing the electronics to be moved in and out of the rack enclosure for maintenance or other access needs. In some embodiments, the immersion cooling system may be configured to be mounted on one or more sets of slides in a standard server rack, allowing the installation of immersion cooling systems using the existing infrastructure (e.g., existing server racks) without requiring significant redesign.

In some embodiments, the immersion cooling system may define a fluid circuit with a separate heat exchanger. In some embodiments, the second liquid coolant (e.g., water flowing through the cooling plates) may flow from the cooling plates into a fluid circuit to a heat exchanger. In some embodiments, the fluid circuit may include a fluid pump to create a flow of coolant through the fluid circuit. In some embodiments, the heat exchanger may be an existing heat exchanger used on a standard server rack. In some embodiments, the immersion cooling system may be a single-phase cooling system (i.e., the coolant does not undergo a phase change and heat is removed by the flow of coolant to a heat exchanger or similar heat removal system). In some embodiments, the immersion cooling system may be a two-phase cooling system (i.e., the coolant may undergo a phase change from liquid to vapor, caused by boiling from heat generated by electronic components, and the vapor is cooled by a condensing unit and returned to liquid state).

According to some aspects of the present description, an immersion cooling system includes a tank defining an open interior volume and including a cooling plate forming at least one wall of the open interior volume. In some embodiments, the cooling plate may form a bottom surface of the tank (i.e., the wall of the open interior volume may be a bottom wall, or bottom side, defining the volume.) In some embodiments, the wall of the open interior volume may be a wall dividing the open interior volume into smaller subvolumes.

In some embodiments, a first liquid coolant may at least partially fill the open interior volume. In some embodiments, a second liquid coolant may be allowed to flow through at least a portion of the cooling plate. In some embodiments, an electronic device (e.g., an electronic server) may be at least partially immersed in the first liquid coolant within the open interior volume. In some embodiments, the first liquid coolant may be a dielectric fluid, and the second liquid coolant may be facility water (i.e., tap water). In some embodiments, the first liquid coolant and the second liquid coolant may be the same. In some embodiments, the immersion cooling system may be configured to mount in a standard server rack (e.g., a 42 U 19-inch rack).

In some embodiments, the cooling plate may be part of a fluidic circuit and in fluidic communication with a heat exchanger. In some embodiments, coolant fluid flowing through the cooling plate may transfer heat generated by the electronic device through a fluid channel defined in the interior of the cooling plate, and into the fluidic circuit to be transported to the heat exchanger. In some embodiments, the heat exchanger will remove heat from the coolant and return the coolant to the cooling plate through the completion of the fluidic circuit. In some embodiments, a pump may be included in the fluidic circuit to ensure transport of the coolant fluid through the fluidic circuit.

According to some aspects of the present description, a method of cooling electronic devices (e.g., electronic servers) includes the steps of disposing a plurality of cooling plates so as to define a plurality of subvolumes; at least partially filling each subvolume with a first coolant liquid, such that each of the plurality of cooling plates is at least partially immersed in the first coolant liquid; providing a second coolant fluid disposed within the cooling plate; and disposing at least one electronic device in at least one subvolume such that it is at least partially immersed in the first coolant fluid. In some embodiments, the method includes the steps of creating a fluidic circuit between the plurality of cooling plates and a heat exchanger, and circulating the second coolant fluid through the circuit. In some embodiments, the method may also include the use of a pump to circulate the second coolant fluid through the fluidic circuit.

In some embodiments, the first liquid coolant may be a dielectric fluid, and the second liquid coolant may be facility water (i.e., tap water). In some embodiments, the first liquid coolant and the second liquid coolant may be the same. In some embodiments, the immersion cooling system may be configured to mount in a standard server rack (e.g., an industry-standard 19-inch server rack).

Figure 1A:
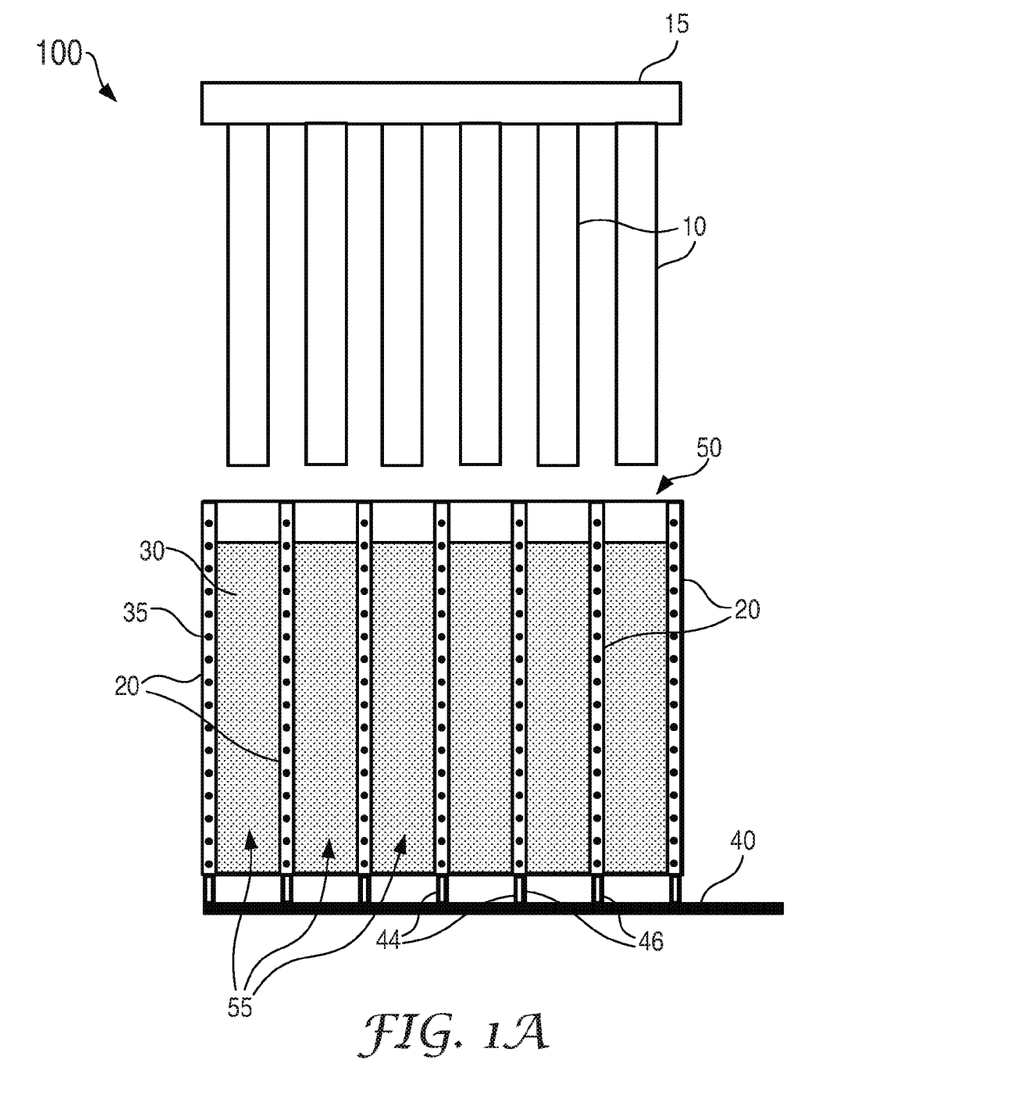
FIG. 1A is an exploded side view of an immersion cooling system, in accordance with an embodiment of the present description.

Turning now to the figures, FIG. 1A is an exploded side view of an embodiment of an immersion cooling system of the present description. The immersion cooling system 100 includes a tank 50 defining an open interior volume. In some embodiments, the open interior volume of tank 50 is divided into a number of subvolumes 55 by one or more cooling plates 20. In some embodiments, the outer walls of tank 50 may also be cooling plates 20, as shown in FIG. 1A, or may be coincident with individual cooling plates 20. In some embodiments, each of the subvolumes 55 may be filled or partially filled with a first coolant liquid 30. In some embodiments, each subvolume 55 may be fluidically isolated from each of the other subvolumes 55. In other embodiments, at least one subvolume 55 may be in fluid communication with at least one other subvolume 55 (i.e., such that the first coolant fluid can flow from one subvolume 55 into at least one other subvolume 55).

In some embodiments, each of cooling plates 20 may define a fluid channel or pathway through an interior portion of the cooling plate 20. In some embodiments, a second liquid coolant 35 may flow through cooling plates 20. In some embodiments, each cooling plate 20 may have a fluid inlet 44 and a fluid outlet 46, connecting the fluid pathway within each cooling plate 20 to an external fluid conduit 40. In some embodiments, external fluid conduit 40 may define a fluid circuit, such that coolant from external fluid conduit 40 may enter each cooling plate 20 through the fluid inlet 44, flow through the interior of the cooling plate 20, and exit the cooling plate 20 via the fluid outlet 46 to be returned to the external fluid conduit 40. In some embodiments, the external fluid conduit may be in fluidic communication with a heat exchanger and/or a fluid pump (not shown in FIG. 1A, but discussed later in additional detail elsewhere herein.)

In some embodiments, the first liquid coolant may be a dielectric fluid, and the second liquid coolant may be facility water (i.e., ordinary tap water). In some embodiments, the first liquid coolant and the second liquid coolant may be the same substance.

In some embodiments, one or more electronic devices 10 may be disposed such that each electronic device 10 fits within one of the subvolumes 55. In some embodiments, the electronic devices 10 may be, for example, computer servers. In some embodiments, the one or more electronic devices 10 may be lowered into the subvolumes 55 such that each electronic device is at least partially immersed in the first liquid coolant and disposed adjacent to at least one cooling plate 20. In some embodiments, each electronic device 10 may be disposed between two of the spaced-apart cooling plates 20 when the electronic devices 10 are lowered into subvolumes 55.

In some embodiments, the electronic devices 10 may be suspended from or otherwise attached to mounting hardware 15, which holds the electronic devices 10 in place. In some embodiments, mounting hardware 15 may be one or more physical rails extending across an open side (e.g., an open top side) of the tank 50. Mounting hardware 15 may be any appropriate means of holding the electronic devices 10 in position, including but not limited to a flat plate, a set of brackets, a mounting collar/fixture, a frame extending down into the subvolumes 55, or any other appropriate means. In some embodiments, the mounting hardware 15 may be optional, and each electronic device 10 may rest on a bottom surface of each subvolume 55 or be otherwise supported or suspended from the walls of the tank 50 or cooling plates 20. For example, in some embodiments, electronic device 10 may include an integral side rail which may be used to guide the electronic device 10 into the subvolume 55. In some embodiments, an integral side rail on an electronic device 10 may be supported on a wall of the subvolume 55, or on a corresponding support rail (not shown) built into a wall of subvolume 55.

It should be noted that, in some embodiments, first liquid coolant 30 is kept separate from second liquid coolant 35, and that first liquid coolant 30 cannot enter external fluid conduit 40. This enables the use of a relatively small amount of a more expensive coolant as first liquid coolant 30, such as a dielectric fluid, minimizing system expense. In some embodiments, the first liquid coolant 30 may be static (i.e., the volume of fluid may not circulate and is held relatively constant.) The second liquid coolant 35 may be a less expensive coolant, such as facility water, which may be circulated inexpensively, and which may be readily available in existing electronics facilities without significant upgrades.

Figure 1B:
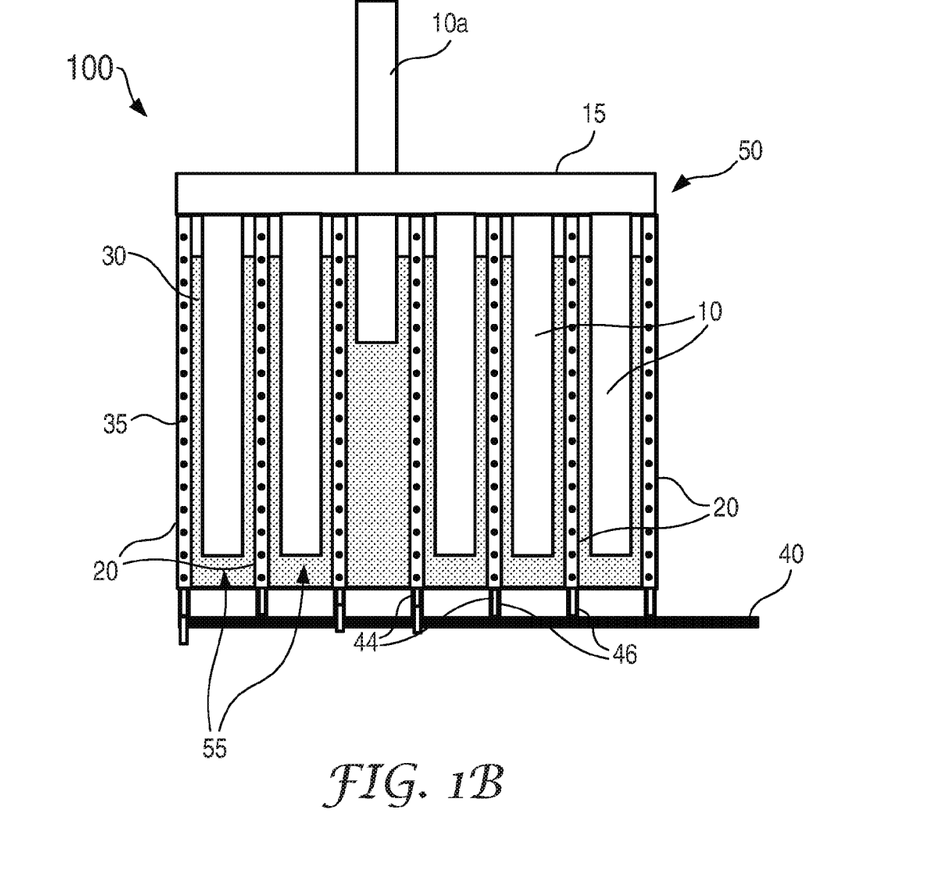
FIG. 1B is a side view of an immersion cooling system, in accordance with an embodiment of the present description.

FIG. 1B is a side view of an immersion cooling system of FIG. 1A when it is assembled, with electronic devices 10 disposed at least partially in subvolumes 55 and at least partially immersed in first coolant liquid 30. The components shown in FIG. 1B are common to the components of FIG. 1A, and like-numbered components server similar functions. In the embodiment of FIG. 1B, one electronic device 10a is shown partially elevated out of tank 50 to illustrate that, in some embodiments, electronic devices 10 may be independent of each other and independent of any mounting hardware 15, such that they may be serviced or swapped out as necessary.

It should be noted that, in FIG. 1B, an amount of first liquid coolant 30 can be seen on either side of each electronic device 10 (i.e., inside each subvolume 55, between the electronic device 10 and cooling plates 20. In some embodiments, this space may be zero or near zero (i.e., such that the sides of electronic device 10 fit snugly against and/or adjacent to cooling plates 20) to allow for more efficient transfer of heat from electronic device 10 into cooling plate 20. In some embodiments, the electronic device 10 may have an outer enclosure that forms an outer boundary and protective case for electronics encased within. In some embodiments, this outer enclosure may allow liquid coolant to pass through the enclosure to surround the electronics inside. These configurations are examples only, and not intended to be limiting in any way. The figures presented are not intended to be to scale.

Figure 1C:
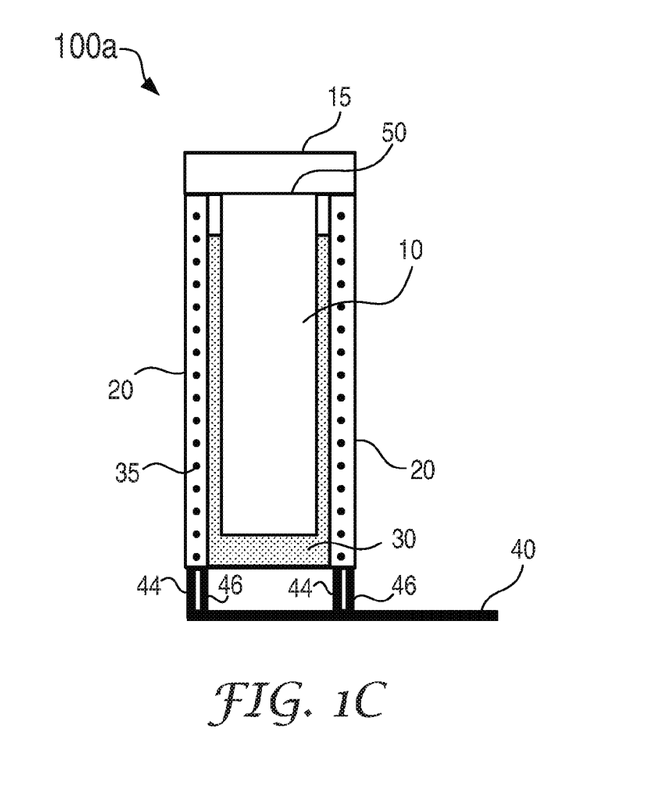
FIG. 1C is a side view of an immersion cooling system, in accordance with an alternate embodiment of the present description.

FIG. 1C is a side view of an alternate embodiment of an immersion cooling system 100a. Many of the components shown in FIG. 1C are common to the components of FIGS. 1A and 1B, and like-numbered components server similar functions. In the embodiment of FIG. 1C, tank 50 defines a single open interior volume (no separate subvolumes) and one or more of the walls of tank 50 are cooling plates 20. In some embodiments, one or more cooling plates may define one or more walls of tank 50. In some embodiments, a cooling plate 20 may define a bottom wall (bottom surface) of tank 50. In some embodiments, one or more electronic devices 10 (e.g., an electronic server, or a bank of servers) may be placed into tank 50, disposed such that it is adjacent or in contact with at least one cooling plate 20. In some embodiments, tank 50 may be at least partially filled with a first coolant liquid 30. In some embodiments, first coolant liquid 30 may be a dielectric fluid.

In some embodiments, cooling plates 20 define an internal fluid channel, starting with a fluid inlet 44 which allows coolant to flow into cooling plate 20, and ending with a fluid outlet 46, which allows coolant to exit cooling plate 20. In some embodiments, a second liquid coolant 35 is allowed to flow through the fluid channel of the cooling plate 20. In some embodiments, the second liquid coolant 35 may be facility water (i.e., tap water).

Figure 2:
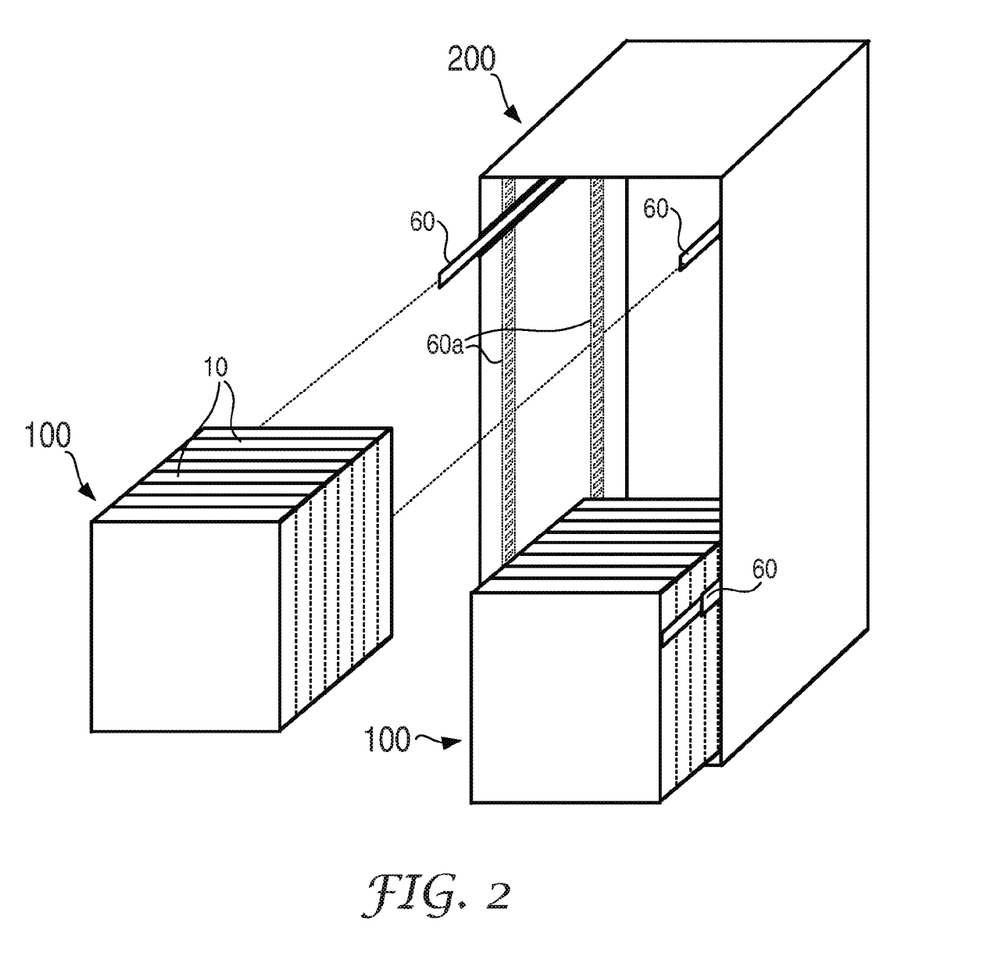
FIG. 2 is a perspective view of a rack-mounted immersion cooling system, in accordance with an embodiment of the present description.
Figure 3:
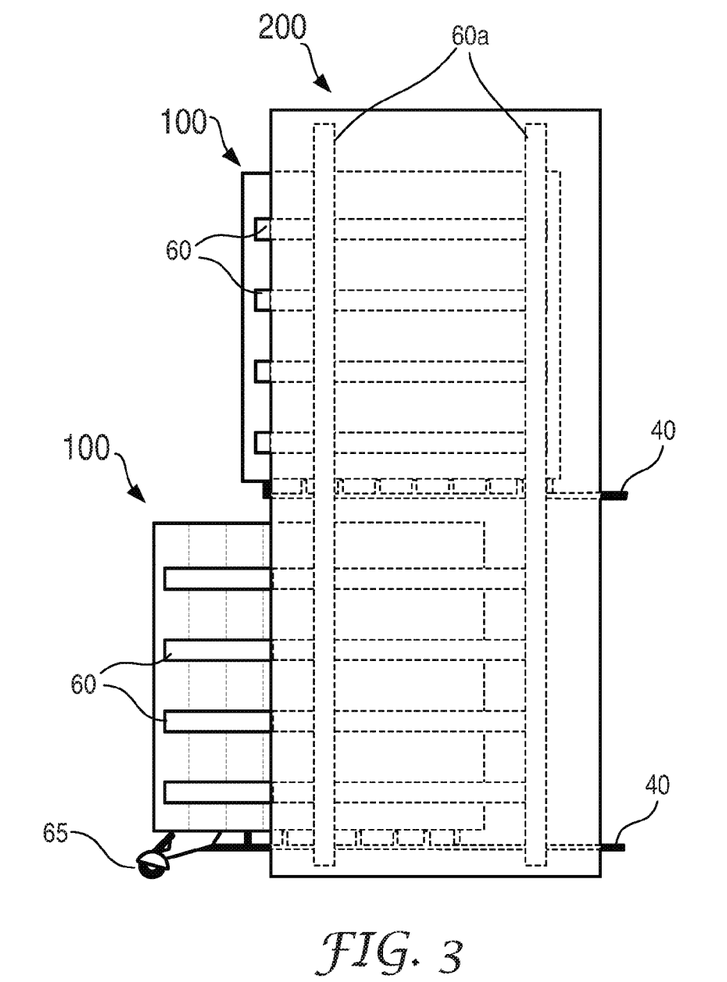
FIG. 3 is a side view of a rack-mounted immersion cooling system, in accordance with an embodiment of the present description.

In some embodiments, it may be useful to mount the immersion cooling system in an industry-standard server rack, such as in the cases where the immersion cooling system is replacing more traditionally mounted computer servers (e.g., server blades mounted directly in a standard server rack and cooled by air circulating through and around the server rack.) FIGS. 2 and 3 illustrate how the immersion cooling system of FIGS. 1A-1C may be mounted in a standard server rack. Turning to FIG. 2, one or more immersion cooling systems 100 may be configured such that they conform to the dimensions of a standard server rack 200 (e.g., a 19-inch server rack, as described elsewhere herein). The immersion cooling system 100 may be any of the immersion cooling system embodiments described in FIGS. 1A-1C, or may include other embodiments consistent with the present description. In some embodiments, an immersion cooling system 100 may include a plurality of electronic devices 10, as well as liquid coolants, cooling plates, fluid conduits, etc., as described herein (but, for simplicity, omitted from FIG. 2). A standard server rack 200 may include vertical mounting mils 60a, to which horizontal mounting rails 60 may be attached to hold the immersion cooling system 100. In some embodiments, horizontal mounting rails 60 may have a "drawer slide" configuration to allow the immersion cooling system 100 to be slid in and out of rack 200. In some embodiments, the immersion cooling tank 100 may be mounted directly to vertical mounting rails 60a (i.e., no horizontal mounting rails 60). The mounting hardware described herein is intended as an example only, and not meant to be limiting. Any appropriate method of mounting immersion cooling systems 100 and any appropriate mounting hardware (including no hardware) may be used. FIG. 2 shows a single set of horizontal mounting rails 60 for each immersion cooling system 100 for simplicity. Any appropriate number of horizontal mounting rails 60 may be used.

FIG. 3 is a side view of the rack-mounted immersion cooling system of FIG. 2 showing additional detail. Dashed lines are used to show hidden (internal) details of the server rack 200, including one possible arrangement of horizontal mounting rails 60 and vertical mounting rails 60a. Dashed lines are also used to show an embodiment of external fluid conduits 40 which form a fluid circuit for coolant with the cooling plates (not shown, see for example FIG. 1A). Fluid conduit 40 is shown exiting the rear of server rack 200 in the embodiment of FIG. 3. However, any appropriate routing of fluid conduit 40 may be used (e.g., routing through the floor of rack 200).

In some embodiments, a support leg 65 may be placed on the bottom of the immersion cooling systems 100. In some embodiments, support leg 65 may be a caster wheel which allows the immersion cooling system 100 to roll out of the server rack 200 for maintenance purposes. In some embodiments, the support leg 65 may be folded up under immersion cooling system 100 when it is pushed back into server rack 200. In some embodiments, an immersion cooling system 100 mounted in an upper position of server rack 200 may have a longer support leg 65, which folds down to the ground (or to a resting position on the server rack 200) to support the weight of the upper system as it is pulled out for maintenance.

Figure 4:
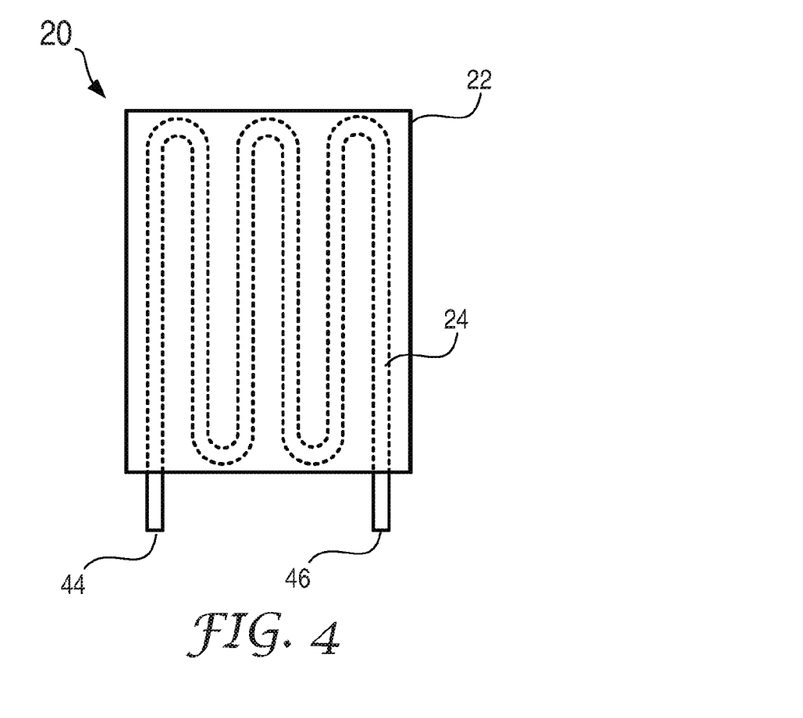
FIG. 4 is a front view of a cooling plate for use in an immersion cooling system, in accordance with an embodiment of the present description.

FIG. 4 is a front view of an embodiment of a cooling plate 20 for use in the immersion cooling system of the present description. In some embodiments, cooling plate 20 may have a plate body 22, constructed of a thermally-conductive material (e.g., aluminum). A fluid channel 24 may pass through at least a portion of plate body 22. FIG. 4 shows one possible configuration of a fluid channel 24, entering the cooling plate through fluid inlet 44 and exiting through fluid outlet 46. It is important to note that fluid inlet 44 and fluid outlet 46 are thus labeled somewhat arbitrarily, and either may provide the function of a fluid inlet or outlet. In this embodiment, fluid channel 24 is a narrow, tube-like channel which weaves back and forth through the interior of plate body 22. However, any appropriate channel shape and configuration may be used. For example, a large portion of the interior of plate body 22 may be hollow, serving as one, wide fluidic passage through the cooling plate 20. In some embodiments, a liquid coolant may flow through fluid channel 24. Heat from electronic devices adjacent to and/or in contact with cooling plate 20 may be conducted through plate body 22 and into fluid channel 24, where the heat is transported from the cooling plate 20 by the liquid coolant flowing through fluid channel 24. In some embodiments, cooling plate 20 may include features (not shown) for increasing the amount of surface area in contact with the first coolant liquid (the coolant liquid inside each subvolume, such as first coolant liquid 30 of FIG. 1A), to facilitate heat transfer. These features may include, but are not limited to, ribs, fins, and pin fins.

Figure 5:
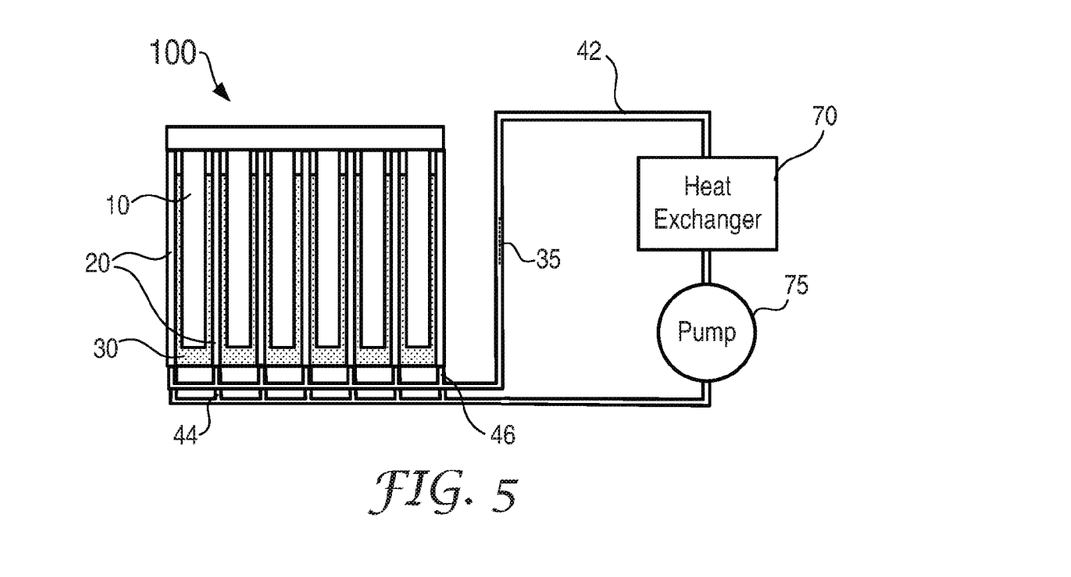
FIG. 5 is a schematic view of an immersion cooling system in fluidic communication with a heat exchanger, in accordance with an embodiment of the present description.

In some embodiments, the immersion cooling system 100 may be part of a fluidic circuit, such that the coolant leaving the cooling plates may be brought to a heat exchanger or similar means of removing the heat from the coolant. FIG. 5 provides a schematic view of an immersion cooling system in fluidic communication with a heat exchanger. In some embodiments, an immersion cooling system 100 (e.g., for example, immersion cooling system 100 of FIG. 1A or immersion cooling system 100a of FIG. 1C) may be connected to a fluidic circuit 42, routing liquid coolant 35 removed from cooling plates 20 to heat exchanger 70, where the heat may be removed and sent back to the immersion cooling system 100. Fluidic circuit 42 is connected at one end to the fluid inlets 44 of a plurality of cooling plates, and connected at the other end to the fluid outlets 46 of the plurality of cooling plates, creating a complete fluidic circuit. In some embodiments, coolant 35 may be circulated through fluidic circuit 42 by a pump 75. Heat from coolant 35 entering heat exchanger 70 will be cooled (e.g., heat may be routed through cooling coils, extracted by heat fins, or removed via other types of cooling hardware) and returned to the immersion cooling system 100 via fluidic circuit 42.

Figure 6:
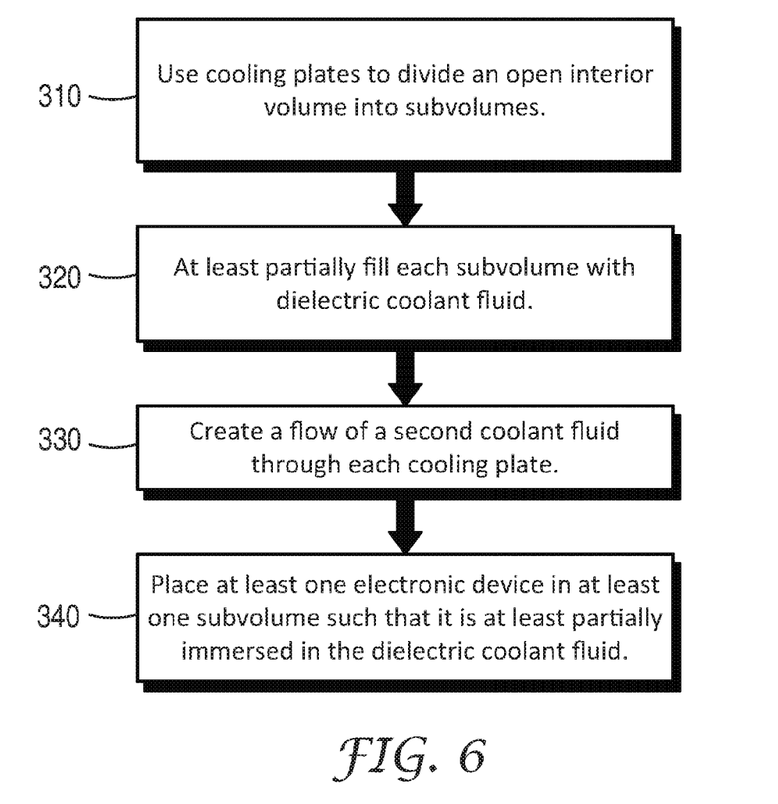
FIG. 6 is a flow chart detailing steps in an immersion cooling method, in accordance with an embodiment of the present description.

FIG. 6 is a flow chart detailing steps in an embodiment of an immersion cooling method. In step 310, a tank or other open interior volume is divided into a number of subvolumes using one or more cooling plates. In step 320, each subvolume is at least partially filled with a first coolant liquid, which in some embodiments may be a dielectric coolant fluid. In step 330, a second coolant fluid, which in some embodiments may be water (i.e., tap or facility water), is routed through an interior channel of each cooling plate. In step 340, at least one electronic device (e.g., an electronic server) is disposed inside at least one of the subvolumes, such that the electronic device is at least partially submerged in the first coolant liquid.

Figure 7A:
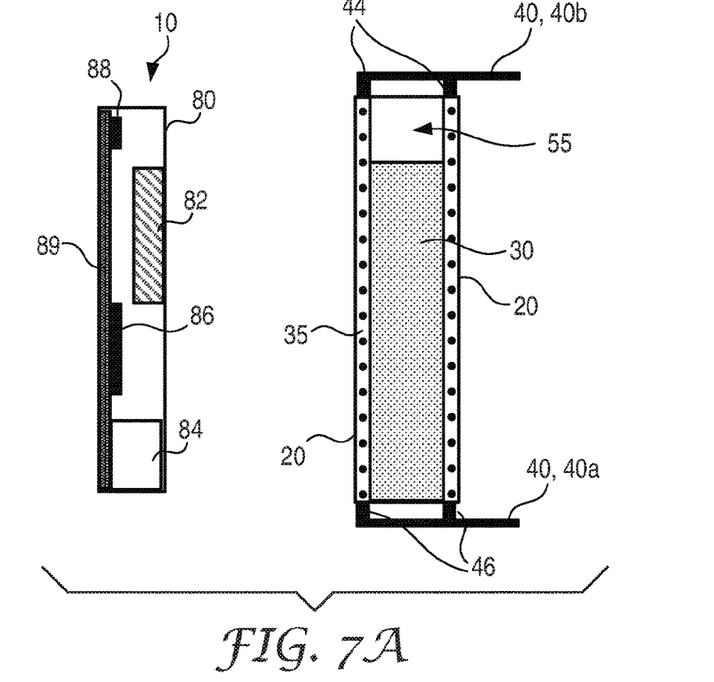
FIG. 7A is a front exploded view of a subvolume and corresponding electronic device of an immersion cooling system, in accordance with an embodiment of the present description.
Figure 7B:
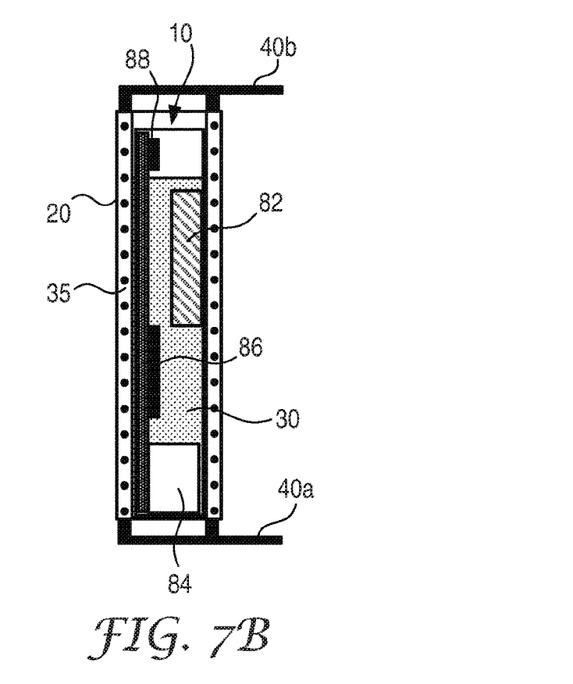
FIG. 7B is a front view of an assembled subvolume and electronic device of an immersion cooling system, in accordance with an embodiment of the present description.

FIGS. 7A and 7B provide front views of an alternate embodiment of an immersion cooling system of the present description, focusing on a single subvolume and providing additional detail for the electronic device. FIG. 7A is an exploded (unassembled) view of a single subvolume and a corresponding electronic device for use in an immersion cooling system. In some embodiments, an electronic device 10 may include a printed circuit board (PCB) 89 having one or more electronic components 86/88. In some embodiments, PCB 89 may be disposed inside of an outer enclosure 80. In other embodiments, PCB 89 may not have an outer enclosure, and may be disposed directly into a subvolume 55. In some embodiments, a filler material 82 as described elsewhere herein may be added (e.g., attached to the PCB 89 or the inside of the enclosure 80) for the purpose of reducing the amount of the first liquid coolant 30 needed inside the subvolume 55 (i.e., by reducing the interior volume). In some embodiments, electronic device 10 may include fans and/or fluidic pumps 84 to improve the flow/circulation of liquid coolant throughout the subvolume and the interior of the electronic device 10 to facilitate heat transfer to the cooling plates 20.

In some embodiments, subvolume 55 may have one or more cooling plates 20 defining or attached to sides of the subvolume 55. A fluid channel 40 may supply a second liquid coolant 35 (e.g., a water-based coolant) to the cooling plates. In some embodiments, fluid channel 40 may be separated into two or more parts, such as a fluid inlet portion 40b and a fluid outlet portion 40a. For example, fluid inlet portion 40b may provide lower-temperature coolant 35 (e.g., coolant leaving a separate heat exchanger, not shown) to fluid inlets 44 of cooling plates 20, where fluid inlets 44 enter near the top of cooling plates 20, and fluid outlet portion 40a may accept higher-temperature coolant 35 (i.e., coolant that has absorbed heat from electronic device 10) from fluid outlets 46 (e.g., to transmit the fluid to a heat exchanger where excess heat is removed.)

FIG. 7B is a front view of the subvolume and electronic device of FIG. 7A (and may be viewed simultaneously with FIG. 7A for the following discussion), but in assembled form (i.e., the electronic device 10 is at least partially inserted into subvolume 55). In some embodiments, outer enclosure 80 (if present) may be sized such that the walls of enclosure 80 touch or are otherwise adjacent to cooling plates 20 in order to facilitate heat transfer to the cooling plates 20. In some embodiments, coolant 30 may be allowed to flow into enclosure 80 and be in direct contact with at least a portion of PCB 89. In some embodiments, some components 86 may be immersed fully in first liquid coolant 30, and other components 88 may be positioned on PCB 89 so as to be held up out of first liquid coolant 30. For example, component 86 may be a processor or memory module which generates significant heat (requiring liquid cooling), and component 88 may be an electronic component (e.g., an optical connection or a switch) which is better not fully immersed. In some embodiments, component 84 may be PCB-mounted cooling fans, fluid pumps, a combination thereof, or any other appropriate devices which can aid in the circulation of fluid through the subvolume 55.

Terms such as "about" will be understood in the context in which they are used and described in the present description by one of ordinary skill in the art. If the use of "about" as applied to quantities expressing feature sizes, amounts, and physical properties is not otherwise clear to one of ordinary skill in the art in the context in which it is used and described in the present description, "about" will be understood to mean within 10 percent of the specified value. A quantity given as about a specified value can be precisely the specified value. For example, if it is not otherwise clear to one of ordinary skill in the art in the context in which it is used and described in the present description, a quantity having a value of about 1, means that the quantity has a value between 0.9 and 1.1, and that the value could be 1.

Terms such as "substantially" will be understood in the context in which they are used and described in the present description by one of ordinary skill in the art. If the use of "substantially equal" is not otherwise clear to one of ordinary skill in the art in the context in which it is used and described in the present description, "substantially equal" will mean about equal where about is as described above. If the use of "substantially parallel" is not otherwise clear to one of ordinary skill in the art in the context in which it is used and described in the present description, "substantially parallel" will mean within 30 degrees of parallel. Directions or surfaces described as substantially parallel to one another may, in some embodiments, be within 20 degrees, or within 10 degrees of parallel, or may be parallel or nominally parallel. If the use of "substantially aligned" is not otherwise clear to one of ordinary skill in the art in the context in which it is used and described in the present description, "substantially aligned" will mean aligned to within 20% of a width of the objects being aligned. Objects described as substantially aligned may, in some embodiments, be aligned to within 10% or to within 5% of a width of the objects being aligned.

All references, patents, and patent applications referenced in the foregoing are hereby incorporated herein by reference in their entirety in a consistent manner. In the event of inconsistencies or contradictions between portions of the incorporated references and this application, the information in the preceding description shall control.

Descriptions for elements in figures should be understood to apply equally to corresponding elements in other figures, unless indicated otherwise. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. An immersion cooling system, comprising:
    a plurality of spaced-apart cooling plates defining a plurality of subvolumes therebetween, the cooling plates at least partially immersed in a first liquid coolant, so that the first liquid coolant at least partially fills each subvolume;
    a second liquid coolant flowing through at least a portion of each cooling plate; and
    at least one electronic device at least partially immersed in the first liquid coolant within each subvolume;
    wherein the immersion cooling system is configured to be mounted on slides in a standard server rack.

2. The immersion cooling system of claim 1, wherein the first liquid coolant is a dielectric fluid.

3. The immersion cooling system of claim 1, wherein the second liquid coolant is selected from the group consisting of water, ethylene glycol and water solution, diethylene glycol and water solution, and propylene glycol and water solution.

4. The immersion cooling system of claim 1, wherein at least one subvolume of the plurality of subvolumes is in fluidic communication with at least one other subvolume of the plurality of subvolumes.

5. The immersion cooling system of claim 1, wherein the at least one electronic device is an electronic server.

6. The immersion cooling system of claim 5, further comprising a heat exchanger in fluidic communication with the cooling plate.

7. The immersion cooling system of claim 5, wherein the first liquid coolant is a dielectric fluid.

8. The immersion cooling system of claim 5, wherein the second liquid coolant is selected from the group consisting of water, ethylene glycol and water solution, diethylene glycol and water solution, and propylene glycol and water solution.

9. The immersion cooling system of claim 5, wherein the at least one wall of the open interior volume is a wall dividing the open interior volume into subvolumes.

10. An immersion cooling system, comprising:
    a tank defining an open interior volume and comprising a cooling plate forming at least one wall of the open interior volume;
    a first liquid coolant at least partially filling the open interior volume;
    a second liquid coolant flowing through at least a portion of the cooling plate; and
    at least one electronic device at least partially immersed in the first liquid coolant within the open interior volume;
    wherein the immersion cooling system is configured to be mounted on slides in a standard server rack.

11. The immersion cooling system of claim 10, wherein the at least one electronic device is an electronic server.

12. A method of cooling electronic devices, comprising:
    disposing a plurality of cooling plates so as to define a plurality of subvolumes;
    at least partially filling each subvolume with a first coolant liquid, such that each of the plurality of cooling plates is at least partially immersed in the first coolant liquid;
    providing a second coolant fluid disposed within the cooling plate;
    disposing at least one electronic device in at least one subvolume such that it is at least partially immersed in the first coolant fluid; and
    mounting the plurality of cooling plates including the plurality of subvolumes and electronic devices on slides in a standard server rack.

13. The method of claim 12, further comprising:
    creating a fluidic circuit comprising a heat exchanger and the plurality of cooling plates; and
    circulating the second coolant fluid through the fluidic circuit.

14. The method of claim 12, wherein the first liquid coolant is a dielectric fluid.

15. The method of claim 12, wherein the second liquid coolant is selected from the group consisting of water, ethylene glycol and water solution, diethylene glycol and water solution, and propylene glycol and water solution.

16. The method of claim 12, wherein the at least one electronic device is an electronic server.

* * * * *